United States Patent [19]

Goebel

[11] Patent Number: 5,169,472

[45] Date of Patent: Dec. 8, 1992

[54] METHOD OF MAKING A MULTI-LAYER SILICON STRUCTURE

[75] Inventor: Herbert Goebel, Reutlingen, Fed. Rep. of Germany

[73] Assignee: Robert Bosch GmbH, Stuttgart, Fed. Rep. of Germany

[21] Appl. No.: 669,683

[22] Filed: Mar. 14, 1991

[30] Foreign Application Priority Data

Mar. 21, 1990 [DE] Fed. Rep. of Germany ....... 4009090

[51] Int. Cl.$^5$ .................. H01L 21/304; H01L 21/306
[52] U.S. Cl. .................................. 156/281; 156/153; 148/DIG. 12; 148/DIG. 159; 148/DIG. 135; 437/901; 437/974
[58] Field of Search ............. 156/153, 281, 87, 306.3; 357/26; 51/283 R; 148/DIG. 12, DIG. 159, DIG. 135; 437/225, 901, 974, 74

[56] References Cited

U.S. PATENT DOCUMENTS

| 4,671,846 | 6/1987 | Shimbo et al. | 156/153 X |
| 4,883,215 | 11/1989 | Goesele et al. | 156/281 X |
| 5,060,526 | 10/1991 | Barth et al. | 73/702 X |
| 5,062,302 | 11/1991 | Petersen et al. | 73/721 X |

FOREIGN PATENT DOCUMENTS

3918769 12/1989 Fed. Rep. of Germany .

OTHER PUBLICATIONS

Shimbo, M. et al, "Silicon-to-Silicon Direct Bonding Method," J. Appl. Phys. 60(8), Oct. 15, 1986, pp. 2987-2989.
Black, R.D., et al, "Silicon and Silicon Dioxide Thermal Bonding for Silicon-on-Insulator Applications," J. Appl. Phys., 63(8), Apr. 15, 1988, pp. 2773-2777.
Haisma, J., et al, "Silicon-on-Insulator Wafer Bonding-Wafer Thining Technological Evaluatons," Japanese Journal of Appl. Physics, vol. 28, No. 8, Aug. 1989, pp. 1426-1443.
Shimbo, Furukawa & Fukuda, "A Newly Developed Silicon to Silicon Direct Adhesion Method", Journal of the Electrochemical Society, vol. 86-1, 1986, pp. 337-338.

Primary Examiner—Jeff H. Aftergut
Attorney, Agent, or Firm—Frishauf, Holtz, Goodman & Woodward

[57] ABSTRACT

Multi-layer silicon structures particularly micromechanical sensors, can be made by cleaning and polishing respective surfaces of two silicon wafers, assembling the wafers together under clean room conditions and adhering them together by temperature treatment. This method is improved by the pretreatment of the wafer surfaces using fuming nitric acid (e.g., 100% $HNO_3$), rinsing with de-ionized water, drying, and temperature treatment at a lower temperature than was previously thought necessary, namely between 100° and 400° C. This has the advantage that such gentler treatment preserves previously-applied integrated circuit structures, which can therefore be applied before the wafer assembly steps. The method is particularly suitable for producing pressure sensors having a pressure-responsive silicon membrane, and an evaluation circuit integrated on the silicon wafer. Such sensors are suitable for use in motor vehicles for measuring engine pressures and for measuring brake fluid pressures in anti-lock braking systems (ABS).

13 Claims, 1 Drawing Sheet

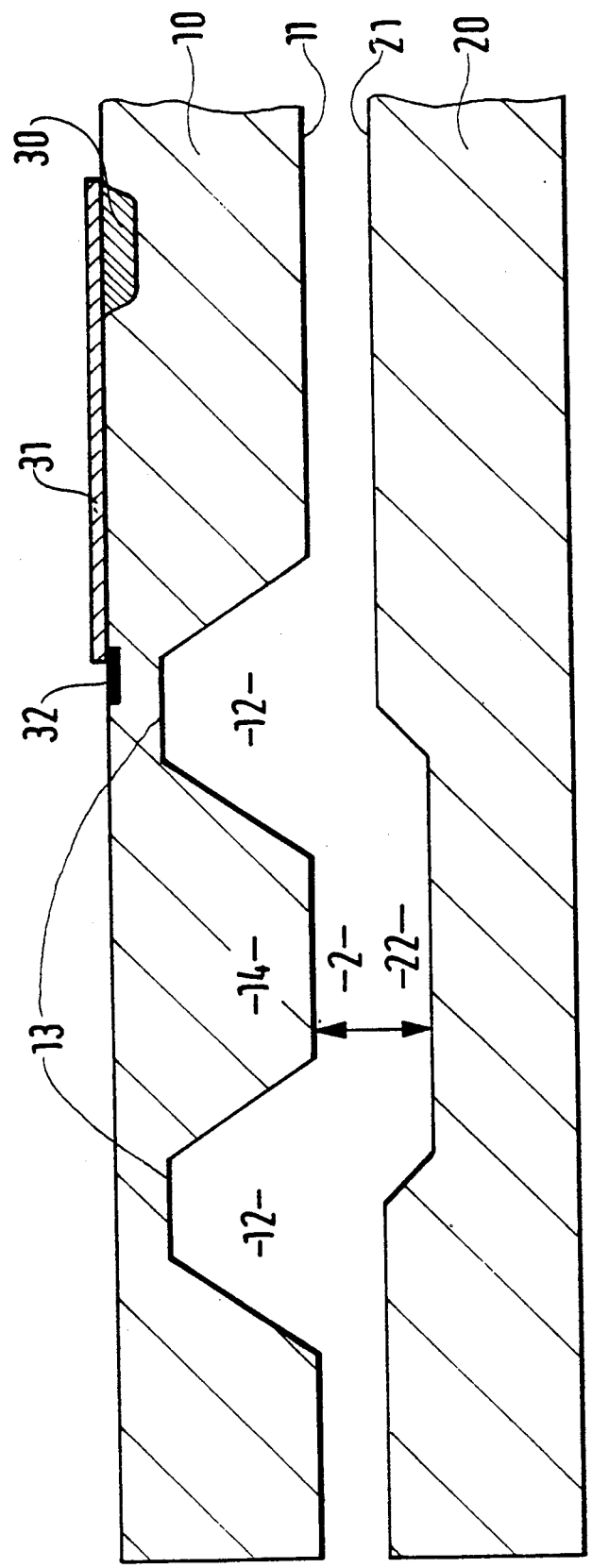

METHOD OF MAKING A MULTI-LAYER SILICON STRUCTURE

Cross-reference to related application, the disclosure of which is incorporated by reference: Ser. No. 07/566,997, METTNER et al., filed Aug. 13, 1990, assigned in part to the assignee of the present application.

FIELD OF THE INVENTION

The present invention relates generally to a method of making a multi-layer silicon structure and, more particularly, to an improved method involving chemical pretreatment at room temperature of silicon wafers and temperature treatment of assembled wafers at temperatures which need not exceed 400° C.

BACKGROUND OF THE INVENTION

In *Journal of the Electrochemical Society: Extended Abstracts*. Vol. 86-1, pages 337–338, Abstract no. 232, entitled "A Newly Developed Silicon to Silicon Direct Adhesion Method" proposes a method of making an adhesion-based connection between two silicon wafers. For this purpose, the wafers are first polished, and their surfaces are "washed" or chemically treated for hydrophilization. Subsequently the prepared surfaces of the wafers to be connected are brought together at room temperature. The bonding process, named Silicon Fusion Bonding (SFB) is ended with temperature treatment of the wafers at about 1000° C. In this process, it is unnecessary to subject the wafers to high pressure. It is also unnecessary to apply voltage between the two wafers.

For chemical treatment of wafers for the bonding process, chemical solutions are specified, which would destroy a sensor system with completed, integrated circuitry, especially one with aluminum conductive tracks. Such treatments disclosed in the literature include:

$H_2SO_4$-$H_2O_2$ (sulfuric acid//hydrogen peroxide) and HCl-$H_2O_2$; (hydrochloric acid/hydrogen peroxide) aqua regia;

RCA cleaning (RCA cleaning is a standard cleaning process for silicon wafers. Two cleaning solutions are used in succession. The first consists of $H_2O$, $H_2O_2$ (30%), and $NH_4OH$ in the ratio 5:1:1. The second consists of $H_2O$, $H_2O_2$ (30%), and HCl (37%) in the ratio 6:1:1;

KOH (potassium hydroxide);
Choline;
hot (about 60°–80° C.) or boiling (about 120° C.) nitric acid [$HNO_3$ (65%)];
Solution of $H_2O_2$ and $NH_4OH$ at 50°–60° C.

SUMMARY OF THE INVENTION

The present invention concerns a method for making a multi-layer silicon structure comprising the steps of
polishing and cleaning surfaces of silicon wafers,
dipping the wafers in fuming nitric acid, e.g., 100% $HNO_3$, then rinsing the wafers with de-ionized water and drying the wafers;
assembling the thus-polished surfaces of the wafers together in a substantially particle-free atmosphere, and
subjecting the assembled wafers to a temperature treatment to form a secure silicon-to-silicon bond,
the temperature treatment being carried out at a temperature between about 100° C. and about 400° C.

The present invention is also directed to a sensor comprising
a first silicon wafer bearing electrical circuit elements and at least one conductive track, and
a second silicon wafer secured to the first wafer, at least one of the wafers being formed with a micromechanical structural element produced by the steps of
cleaning and polishing respective surfaces of the first and second wafers,
rendering the polished surfaces hydrophilic by dipping the wafers in fuming nitric acid, e.g., 100% $HNO_3$,
assembling the hydrophilic surfaces together, and
temperature-treating the assembled wafers at a temperature between 100° C. and 400° C.

The method of the present invention with pretreatment using fuming nitric acid has the advantage over the prior art that neither the finally processed wafer surfaces, nor the aluminum conductive tracks on the wafer are attacked by fuming nitric acid during hydrophilization. A further advantage is that a temperature treatment at relatively low temperatures below 400° C. suffices to form solid mechanical connections, since aluminum tracks on IC's cannot be subjected to high temperatures without negative impacts of their functioning. This has the advantage that the wafer, prior to bonding, can run through the normal, complete IC process (Metal Oxide Semiconductor (MOS) or bipolar). A particular advantage is that the integration of sensor and evaluation circuit can be achieved on a single silicon chip. This results, first, in a miniaturization of the entire system and also simplifies the assembly of the sensor. Further, the reliability of the sensor, especially the electrical connections between the sensor element and the evaluation circuit, increases. With regard to process compatibility, the method is advantageous, since $HNO_3$, in contrast to other hydrophilization chemicals, is often used in IC fabrication.

Particularly advantageous is that the hydrophilization of the surfaces using fuming nitric acid is carried out at approximately room temperature, so that no heating of acids in a clean room is necessary. It is important that particles of dirt or dust are not deposited on clean wafer surfaces to be connected, since such particles may degrade the quality of the bond. The temperature treatment of wafers which come directly from the manufacturer is preferably conducted for a period of time of 10 minutes to 1 hour.

However, wafer surfaces which have been subjected to masking, such as, for example, an oxide layer or a nitride layer, are very hydrophobic, so that a treatment of 4 to 9 hours may be necessary. In this connection, it is also advantageous that the temperature treatment of the silicon wafer is carried out in a nitrogen gas or forming gas (nitrogen/hydrogen mixture) environment, which is easily achieved.

The method of the present invention is especially useful for construction of micromechanical sensors, such as pressure sensors. A hollow space can be created under a thin-etched silicon membrane without jeopardizing the entire system, since, according to the method, silicon wafers (with the same thermal expansion/contract coefficients) are bonded to one another, so that no mechanical stresses occur between the system and the cover due to temperature changes.

In making the connection, no electrical voltage need be applied between the two wafers enclosing the hollow space, so the sensor hollow spaces can advantageously be closed under vacuum, without electrical sparking or gas discharges occurring.

BRIEF DESCRIPTION OF THE DRAWING

FIG. 1 is a cross-section through a preferred embodiment of a sensor structure made according to the method of the present invention.

DETAILED DESCRIPTION OF THE INVENTION

FIG. 1 illustrates a first silicon wafer 10 and a second silicon wafer 20, which are to be bonded to each other, as indicated by the arrow. After their processing, sensors made according to silicon technology require a covering, e.g., for sealing of cavities and recesses or also as a mechanical stop for movable masses. The sensor element and the covering should preferably have the same temperature expansion coefficients, so that temperature changes do not cause mechanical stresses between the sensor element and covering. This criterion is best satisfied by a silicon-silicon system. To achieve a stable mechanical connection of silicon with silicon, the adjacent surfaces 11 and 21 of respective silicon wafers 10 and 20 are first polished and cleaned. The subsequent chemical pretreatment of surfaces 11 and 21 includes a bath of silicon wafers 10 and 20 in fuming nitric acid, e.g., 100% nitric acid, at room temperature, preferably at 15° C. to 30° C. Fuming nitric acid sold under the name "SELECTIPUR" from Merck can be used in the present invention. The duration of the bath depends upon the condition of the surfaces 11 and 21 of silicon wafers 10 and 20. It may range from about 10 minutes to over 4 hours. Finally, the surfaces are rinsed with de-ionized water and dried. This chemical pretreatment serves to hydrophilize surfaces 11 and 21. This strengthens the effect of adhesion between surfaces 11 and 21 when they are assembled. The assembly is carried out under clean room conditions in a particle-free atmosphere.

Upon subsequent temperature treatment, a secure connection between silicon wafers 10 and 20 arises. A silicon to silicon bond is already created between 170° C. and 400° C. which leads, upon attempted separation of the wafers or sawing of the wafer into smaller chips, to breakage of the silicon rather than to separation along the polished surfaces 11 and 21. Measurement of tension forces has established that the breaking strength is in excess of 200 kg/cm$^2$. The temperature treatment can be carried out in, for example, a nitrogen or a forming gas atmosphere (forming gas is a mixture of pure nitrogen and pure hydrogen, for example, in a ratio of 9:1 of 8:1).

Wafer 10 includes, as a micromechanical structural element, an annular membrane 13 with a central seismic mass 14, preferably produced by etching of an annular cavity 12 in surface 11. Further, the upper or outer surface of wafer 10 features a piezo resistance element 32, an adjacent membrane 13, which preferably serves for detection of excursions or oscillations of the membrane. By means of an aluminum conductive track 31, the piezo resistance element 32 is connected to a further circuit element 30, which may be, for example, part of an evaluation circuit. Surface 21 of wafer 20 also features a cavity 22, into which the seismic mass 14 can be displaced, thus flexing membrane 13 in the direction of wafer 20. Bonding of wafers 10 and 20 to each other thus defines a sealed hollow space 2, which is bounded on one side by membrane 13. This means a defined pressure must exist in hollow space 2. For example, this can be achieved by sealing off hollow space 2 in a vacuum.

The bonding method of the present invention, for construction of this sensor, can even be used on silicon wafers which have already had the complete circuitry for the sensor being created applied by conventional IC process technology (Metal Oxide Semiconductor=MOS or bipolar) and on which the aluminum conductive tracks have already been applied. For manufacture of such a sensor, one can thus first carry out the evaluation circuitry using conventional IC process technology on a wafer. Subsequently, in micromechanical fabrication processes, the necessary structural elements, e.g., membranes or paddles, can be formed in the silicon wafer. Thereafter, a further, possibly structured, silicon wafer can be bonded to the first one. The advantage of maintaining this sequence is that the silicon wafer, prior to the IC process, has not yet come into contact with potassium hydroxide. Further, the wafers have, as yet, no thin silicon membranes or paddles which could break.

Wafer thicknesses are generally 380 micrometers or 515 micrometers. The thickness of the membrane is selected according to the pressure range to be measured and is generally 10 micrometers to 40 micrometers.

I claim:

1. A method for making a multi-layer silicon structure comprising the steps of
    polishing and cleaning surfaces of silicon wafers, one of said wafers having aluminum electric conductor tracks on a surface thereof,
    dipping said wafers in a solution consisting essentially of fuming nitric acid having a temperature of from about 15° C. to 30° C., said dipping not destroying the aluminum conductor tracks, then rinsing said wafers with de-ionized water and drying the wafers;
    assembling the thus polished surfaces of the wafers together in a substantially particle-free atmosphere, and
    subjecting the assembled wafers to a heating treatment to form a secure silicon-to-silicon bond, said heating treatment being carried out at a temperature between about 100° C. and about 400° C.

2. The method of claim 1 wherein said dipping is conducted in 100% nitric acid.

3. The method according to claim 1, wherein said heating treatment is carried out between about 170° C. and about 400° C.

4. The method according to claim 2, wherein
    at the time of said dipping, said wafers have not yet been subjected to micromechanical structuring steps, and
    said dipping step comprises immersion in fuming nitric acid for at least about 10 minutes.

5. The method according to claim 2, wherein
    at the time of said dipping, said wafers have already been subjected to micromechanical structuring steps, and
    said dipping step comprises immersion in fuming nitric acid for up to about 4 hours.

6. The method according to claim 1, further comprising carrying out said heating treatment step in an atmosphere consisting essentially of a gas selected from the group consisting of nitrogen gas and forming gas.

7. The method according to claim 1, further comprising prior to said heating treatment, forming a micromechanical structural element in at least one of said wafers.

8. The method according to claim 3, further comprising prior to said heating treatment, forming a micromechanical structural element in at least one of said wafers.

9. The method according to claim 5, further comprising prior to said heating treatment, forming a micromechanical structural element in at least one of said wafers.

10. The method according to claim 6, further comprising prior to said heating treatment, forming a micromechanical structural element in at least one of said wafers.

11. The method according to claim 1, wherein said heating treatment is carried out between 170° C. and 400° C.; said fuming nitric acid is 100% nitric acid and said dipping is conducted for 10 minutes to 4 hours.

12. The method according to claim 11, further comprising carrying out said heating treatment step in an atmosphere of nitrogen gas or a gas comprising hydrogen and nitrogen.

13. The method according to claim 12, further comprising forming a micromechanical structural element in at least one of said wafers prior to said heating treatment.

* * * * *